US010468477B2

(12) United States Patent
Jung et al.

(10) Patent No.: US 10,468,477 B2
(45) Date of Patent: Nov. 5, 2019

(54) ORGANIC LIGHT-EMITTING DISPLAY DEVICE

(71) Applicant: LG DISPLAY CO., LTD., Seoul (KR)

(72) Inventors: Won-June Jung, Seoul (KR); Woo-Sup Shin, Paju-si (KR); Sang-Moo Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 4 days.

(21) Appl. No.: 15/699,655

(22) Filed: Sep. 8, 2017

(65) Prior Publication Data

US 2018/0122888 A1    May 3, 2018

(30) Foreign Application Priority Data

Oct. 31, 2016    (KR) ........................ 10-2016-0143719

(51) Int. Cl.
     *H01L 27/32*      (2006.01)
     *G09G 3/3233*     (2016.01)

(52) U.S. Cl.
     CPC ...... *H01L 27/3276* (2013.01); *H01L 27/3262* (2013.01); *H01L 27/3265* (2013.01); *H01L 27/3272* (2013.01)

(58) Field of Classification Search
     CPC ............. H01L 27/3262; H01L 27/3265; H01L 27/3272; H01L 27/3276; H01L 27/32; H01L 2924/0002; H01L 27/3248; H01L 2924/00; H01L 51/5253; H01L 27/1225; H01L 27/1248; H01L 27/3258; H01L 27/124; H01L 51/0097; H01L 51/52; H01L 27/1214; H01L 51/5237; H01L 2251/301; H01L 2251/5338; H01L 27/1222; H01L 27/1251; H01L 27/1255; H01L 27/1288; H01L 29/78633; H01L 29/7869; G09G 3/3233; G09G 3/3266; G09G 2300/0439;
(Continued)

(56) References Cited

U.S. PATENT DOCUMENTS

2001/0017372 A1*   8/2001   Koyama ........... G02F 1/136286
                                                          257/72
2007/0069205 A1    3/2007   Jinno
(Continued)

FOREIGN PATENT DOCUMENTS

EP      3 029 733 A1    6/2016
JP      200-98409 A    4/2000
(Continued)

*Primary Examiner* — Mark W Tornow
*Assistant Examiner* — Priya M Rampersaud
(74) *Attorney, Agent, or Firm* — Birch, Stewart, Kolasch & Birch, LLP

(57) ABSTRACT

An organic light-emitting display device is discussed, which reduces the area of a pixel drive circuit and increases the aperture ratio of a pixel by forming lines inside the pixel using a semiconductor pattern that forms a channel of each thin-film transistor array. The light-emitting display device includes a plurality of pixels arranged in a matrix form and a plurality of lines configured to supply a signal for driving each pixel, each pixel includes a thin-film transistor including an active layer having a first area and a second area, which are configured as conductors, and a gate electrode, and at least one of the first area and the second area is directly connected to a corresponding line among the lines.

13 Claims, 4 Drawing Sheets

(58) Field of Classification Search
CPC ... G09G 2300/0465; G09G 2300/0861; G09G 2310/0256; G09G 2310/027; G09G 2320/0233; G09G 2330/04; G09G 3/3258; G09G 3/3291; G09G 3/3648; G09G 2300/0842; G02F 1/136286; G02F 2201/123

See application file for complete search history.

(56) References Cited

U.S. PATENT DOCUMENTS

| | | | |
|---|---|---|---|
| 2009/0295773 A1* | 12/2009 | Taneda | G09G 3/3233 |
| | | | 345/211 |
| 2015/0130691 A1* | 5/2015 | Jeon | G09G 3/3225 |
| | | | 345/82 |
| 2015/0137099 A1* | 5/2015 | Choi | G09G 3/3258 |
| | | | 257/40 |
| 2015/0349138 A1 | 12/2015 | Sone et al. | |
| 2016/0005804 A1 | 1/2016 | Oh et al. | |
| 2016/0148989 A1* | 5/2016 | Jin | H01L 27/3276 |
| | | | 257/40 |
| 2016/0210905 A1* | 7/2016 | Lee | H01L 27/1222 |
| 2016/0329391 A1* | 11/2016 | Ko | H01L 27/1222 |
| 2017/0287995 A1* | 10/2017 | Kim | H01L 27/32 |
| 2017/0294464 A1* | 10/2017 | Kwon | H01L 27/1288 |
| 2017/0317104 A1* | 11/2017 | Jeong | H01L 27/1288 |

FOREIGN PATENT DOCUMENTS

| | | |
|---|---|---|
| JP | 2000-276076 A | 10/2000 |
| KR | 10-2016-0027280 A | 3/2016 |
| TW | 201333588 A1 | 8/2013 |
| TW | 201608550 A | 3/2016 |

* cited by examiner

ORGANIC LIGHT-EMITTING DISPLAY DEVICE

CROSS-REFERENCE TO RELATED APPLICATIONS

This application claims the priority benefit of Republic of Korea Patent Application No. 10-2016-0143719, filed on Oct. 31, 2016, which is hereby incorporated by reference in its entirety.

BACKGROUND OF THE INVENTION

Field of the Invention

The present invention relates to an organic light-emitting display device, and more particularly, to an organic light-emitting display device, which may increase the aperture ratio of each pixel by using a semiconductor pattern of a thin-film transistor array as a line.

Discussion of the Related Art

An image display device, which realizes various pieces of information on a screen, is a core technology of the information and communication age, and is being developed in the direction of becoming thinner, lighter, more portable, and having higher performance. In response, as a flat panel display device that is thinner and lighter than a cathode ray tube (CRT), for example, an organic light-emitting display device, which controls the amount of light emitted from an organic light-emitting layer to display an image, is in the spotlight.

In an organic light-emitting display device, a plurality of pixels is arranged in a matrix form to display an image. Here, each pixel includes a light-emitting element, and a pixel drive circuit including, for example, a plurality of transistors and storage capacitors to independently drive the light-emitting element.

Recently, since the area of individual pixels is reduced with an improvement in the resolution of the organic light-emitting display device, in order to minimize a reduction in the aperture ratio of each pixel due to the reduced area of the pixel, the area of each pixel drive circuit also needs to be reduced. However, when the area of the pixel drive circuit is reduced, distances between respective lines, transistors, and storage capacitors are reduced, causing parasitic capacitance between components of the pixel drive circuit, which may cause coupling of multiple signals, or a short-circuit phenomenon in which the lines become interconnected. Thereby, there is a limitation to the extent to which the area of the pixel drive circuit can be reduced.

In particular, in an organic light-emitting display device of the related art, respective electrodes of storage capacitors and thin-film transistors of each pixel drive circuit are connected to a shield layer, which is a lower layer on a substrate, and metal lines, which are formed in the same layer as source and drain electrodes of the thin-film transistor, which is an upper layer on the substrate, through contact holes. Accordingly, since the organic light-emitting display device of the related art requires a predetermined number of contact holes according to the structure of the pixel drive circuit, and has a limitation on the extent to which the area of each contact hole can be reduced in order to prevent the parasitic capacitance and short-circuit mentioned above, the extent to which the area of the pixel drive circuit can be reduced is consequently limited due to the presence of the contact holes.

Due to the problems described above, in a high-resolution organic light-emitting display device, when the area of the pixel drive circuit is not sufficiently reduced in proportion to the reduction in the area of the pixel, the aperture ratio of each pixel may be reduced, causing a reduction in the brightness and luminous efficacy of the organic light-emitting display device.

SUMMARY OF THE INVENTION

Accordingly, the present invention is directed to an organic light-emitting display device that substantially obviates one or more problems due to limitations and disadvantages of the related art.

An object of the present invention is to provide an organic light-emitting display device, which may reduce the area of a pixel drive circuit and increase the aperture ratio of a pixel by forming lines inside the pixel using a semiconductor pattern that forms a channel of each thin-film transistor array.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device includes a plurality of pixels and a plurality of lines configured to drive the pixels, wherein each pixel includes a thin-film transistor including an active layer having a first area and a second area, which are configured as conductors, and a gate electrode. Here, at least one of the first area and the second area of the thin-film transistor is directly connected to a corresponding line among the lines.

An area connected to the line includes an electrode portion integrally formed with a channel area of the thin-film transistor and an extension portion configured to extend from the electrode portion to a top of the line so as to be directly connected to the line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE EMBODIMENTS

Figure 1:
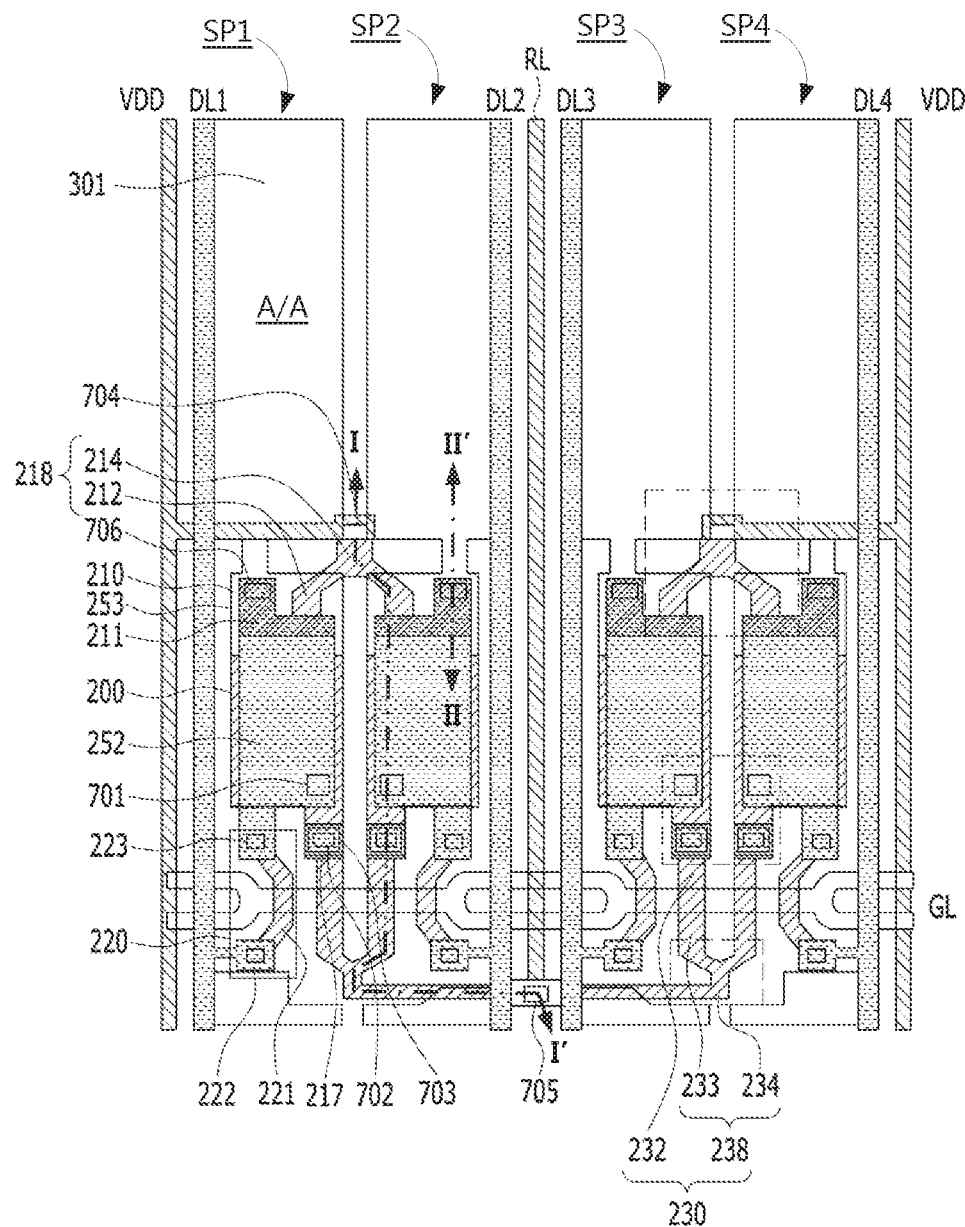
FIG. 1 is a plan view of a pixel structure of an organic light-emitting display device according to one embodiment of the present invention.

Hereinafter, exemplary embodiments of the present invention will be described with reference to the accompanying drawings. In the entire specification, the same or similar elements are denoted by the same reference numerals even though they are depicted in different drawings. In the following description of the present invention, a detailed description of known functions and configurations incorporated herein will be omitted when it may make the subject matter of the present invention rather unclear. Also, the terms used in the following description are terms defined taking into consideration the functions obtained in accordance with the present invention, and may differ from the names of parts of actual products.

In the case of a description with respect to positional relations, when an element is referred to as being, for example, "on", "above", "under", and "aside" another element, it may be directly on the other element or intervening elements may also be present.

Although terms such as, for example, "first" and "second" are used to describe various components, these components are not limited by these terms. These terms are merely used to distinguish any one component from another component. Thus, "a first component" mentioned below may be "a second component" within the technical sprit of the present invention.

In the drawings, the thickness and size of each component are illustrated for convenience of description, and the present invention is not necessary to be limited to the size and thickness of the illustrated component.

Hereinafter, various embodiments of the present invention will be described in detail with reference to the accompanying drawings.

Figure 2:
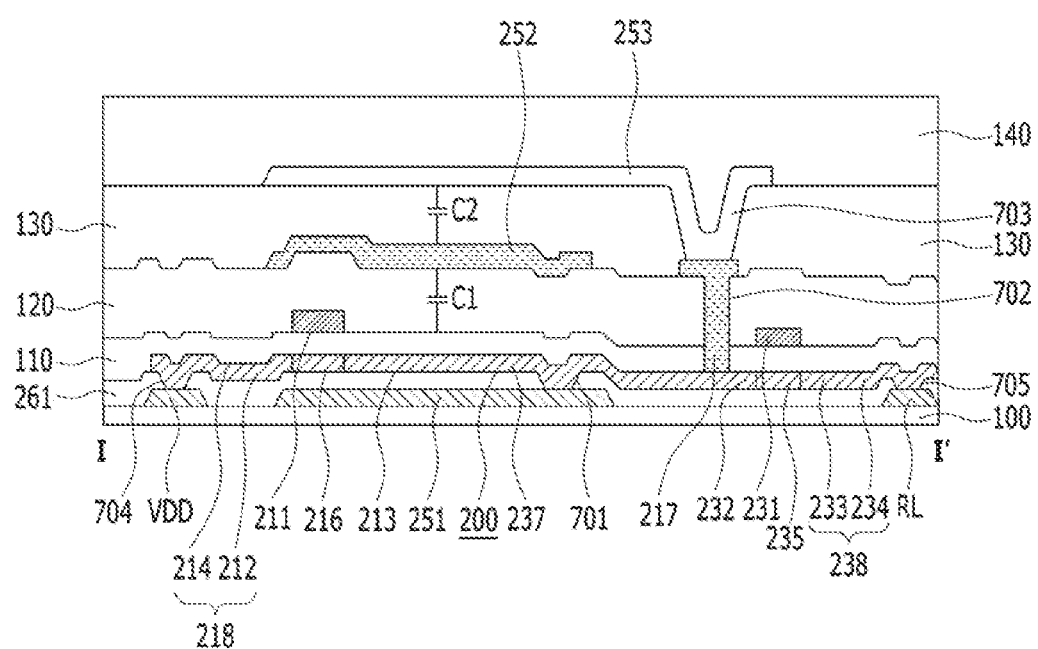
FIG. 2 is a cross-sectional view across line I-I' of FIG. 1 for explaining portion I-I' of FIG. 1.
Figure 3:
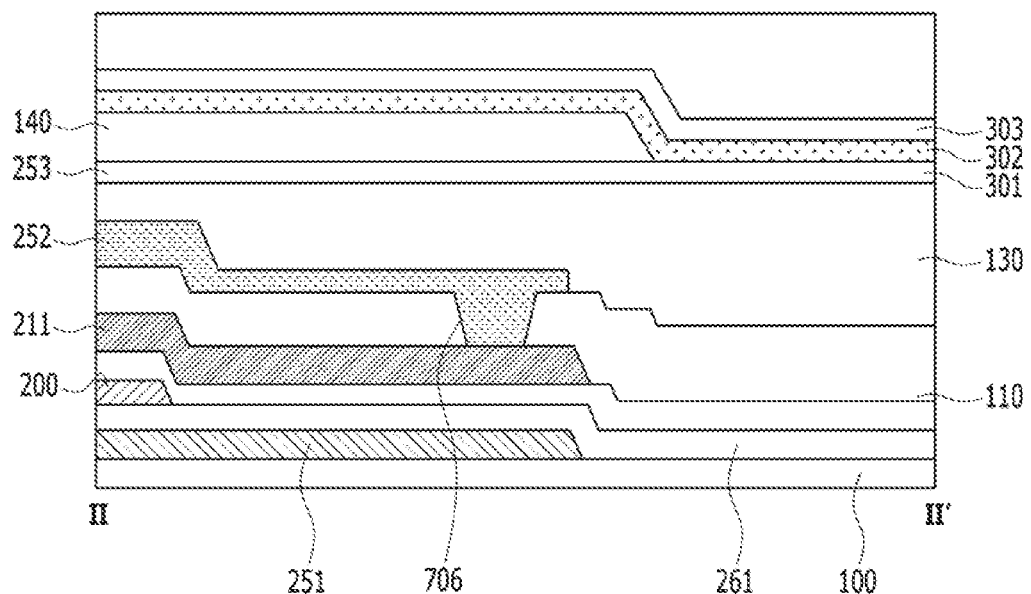
FIG. 3 is a cross-sectional view across line II-II' of FIG. 1 for explaining portion II-II' of FIG. 1.

FIG. 1 is a plan view for explaining a pixel structure of an organic light-emitting display device according to one embodiment of the present invention, and FIG. 2 is a cross-sectional view for explaining the cross section of portion I-I' of FIG. 1. In addition, FIG. 3 is a cross-sectional view for explaining portion II-II' of FIG. 1. All the components of the organic light-emitting display device according to all embodiments of the present invention are operatively coupled and configured.

Referring to FIG. 1, the organic light-emitting display device includes a plurality of pixels SP1 to SP4 arranged in a matrix form. Each of the pixels SP1 to SP4 includes a light-emitting area A/A having a light-emitting layer. In addition, the pixels SP1 to SP4 include respective pixel drive circuits, and include a plurality of lines, which transmit signals to the pixel drive circuits. For example, the organic light-emitting display device according to an embodiment of the present invention may include a gate line GL for supplying a gate signal to the respective pixels SP1 to SP4, a data line DL for supplying a data signal to the respective pixels SP1 to SP4, a power line VDD for applying a power voltage VDD to the pixel drive circuit, and a reference line RL for supplying a reference voltage to the respective pixels SP1 to SP4 and sensing a voltage charged in the respective pixels SP1 to SP4, without being necessarily limited thereto.

The pixel drive circuit includes a plurality of thin-film transistors. Here, each thin-film transistor includes an active layer 200 having a channel area and first and second areas, which are configured as conductors, and a gate electrode. In the present embodiment, for convenience, a source area is described as the first area and a drain area is described as the second area. However, the first area and the second area are not necessarily limited thereto, and the first area may be the drain area and the second area may be the source area according to the structure of the thin-film transistor.

In at least one of the thin-film transistors, at least one area among the first area and the second area may be directly connected to any one of the lines. In other words, instead of forming source and drain electrodes on the first area and the second area, the active layer 200 of the thin-film transistor is configured as a conductor and is utilized as an electrode and a line so that the active layer 200 is directly connected to the other lines.

The feature described above will be described below in detail with reference to the embodiment of FIGS. 1 to 3. The pixel drive circuit of the organic light-emitting display device according to the embodiment of FIGS. 1 to 3 has a 3T1C structure that includes a switching transistor 220, a driving transistor 210, a sensing transistor 230, and a storage capacitor Cst, which are disposed on a substrate 100. However, the pixel drive circuit according to the present invention is not necessarily limited to the above-described structure, and various other structures may be applied according to the design of the pixel drive circuit.

A gate electrode of the switching transistor 220 may constitute a portion of the gate line GL and may be disposed along with the gate line GL. An input electrode 222 of the switching transistor 220 may be connected to the data line DL, and an output electrode 223 may be connected to an intermediate electrode 252 of the storage capacitor Cst. Here, the input electrode may be formed by extending from the data line DL, and the output electrode may be formed by extending from the intermediate electrode of the storage capacitor Cst. However, the switching transistor 220 of the present invention is not necessarily limited to the above-described structure.

The switching transistor 220 includes an active layer 221 configured to overlap the gate electrode. The active layer is configured such that a channel area is formed in the area thereof that overlaps the gate electrode and such that first and second areas are formed at opposite sides of the channel area so as to come into contact with the input electrode 222 and the output electrode 223 respectively.

In an N-type transistor, the first area 222 may be a source area and the second area 223 may be a drain area. In a P-type transistor, the first area 222 may be a drain area and the second area 223 may be a source area.

Referring to FIGS. 2 and 3, the driving transistor 210 includes a gate electrode 211 and an active layer 200. Explaining the active layer 200 in more detail, a channel area 216 is formed below the gate electrode 211 and a gate insulation layer 110 is located between the gate electrode 211 and the channel area 216. In addition, a first area 213 and a second area 218, which are configured as conductors, are located at opposite sides of the channel area 216. Here, the second area 218 may be an input area that receives a drive voltage from a power line VDD, and the first area 213 may be an output area that outputs the drive voltage.

Referring to FIG. 2, the second area 218 extends to the top of the power line VDD. Here, the second area 218 includes a first electrode portion 212, which is integrally formed with the channel area 216 and is configured as a conductor, and a first extension portion 214, which extends from the first electrode portion 212 and comes into contact with the power line VDD. Here, the first extension portion 214 may come into contact with first electrode portions 212 of two neighboring pixels SP at the same time. Thereby, the first extension portion 214 supplies the drive voltage, input from the power line VDD, to the first electrode portions 212 of the two neighboring pixels SP at the same time.

A buffer layer 261 is located between the power line and the first extension portion 214. The buffer layer 261 has the feature of preventing the permeation of moisture or impurities through the substrate 100.

A portion of the power line VDD is exposed through a fourth contact hole 704. The first extension portion 214 comes into contact with the power line VDD through the fourth contact hole 704.

The first area 213 may extend from the channel area 216 so as to be integrally formed with the channel area 216, and the active layer in the first area 213 may serve as a lower electrode of the storage capacitor Cst.

The configuration of the storage capacitor Cst will be described below. The gate insulation layer 110 described above is located on the active layer 200, which constitutes a lower electrode 237, and an interlayer insulation layer 120 is located so as to cover the gate electrode 211. An intermediate electrode 252 is formed on the interlayer insulation layer 120 in the area in which the intermediate electrode 252 overlaps the lower electrode 237, and a planarization layer 130 is located so as to cover the intermediate electrode 252. An upper electrode 253 is located on the planarization layer 130. In this way, the storage capacitor Cst, which includes double capacitors between the lower electrode 237 and the intermediate electrode 252 and between the intermediate electrode 252 and the upper electrode 253, is provided. Here, a shield layer 251 is located on the substrate 110 below the lower electrode 237 in the same layer as the power line VDD using the same material as the power line VDD, for example, a metal material. As mentioned above, the buffer layer 261 is located on the power line VDD and the shield layer 251. The buffer layer 261 further includes a first contact hole 701, which exposes a portion of the shield layer 251. The lower electrode 237 is connected to the shield layer 251 through the first contact hole 710 so that the lower electrode 237 and the shield layer 251 form an equivalent potential therebetween.

The shield layer 251 may prevent light from being introduced into a semiconductor layer 200 and may reduce parasitic capacitance generated between the lower electrode 237 and the data lines DL, thereby reducing a phenomenon of coupling between the data line DL and the gate electrode 211 of the driving transistor 210. Although the shield layer 251 of the related art has been connected to the intermediate electrode 252 through a contact hole, in the embodiment of the present invention, the shield layer 251 is connected to the active layer 200, which enables a reduction in the area of the first contact hole 701, resulting in an additional increase in the aperture ratio of the pixel.

A portion of the interlayer insulation layer 120 and the gate insulation layer 110 is removed in the area that corresponds to the lower electrode 237, i.e., the edge of the first area 213 of the active layer 200 so as to form a second contact hole 702, which exposes a portion of the first area 213. A connection electrode 217 is formed so as to come into contact with the first area 213 through the second contact hole 702. Here, the connection electrode 217 may be an output electrode of the driving transistor 210, for example, a source electrode, without being necessarily limited thereto. The connection electrode 217 is formed in the same layer as the intermediate electrode 252 of the storage capacitor Cst using the same material as the intermediate electrode 252. The planarization layer 130 is formed on the connection electrode 217 and the intermediate electrode 252. A portion of the planarization layer 130 is removed to form a third contact hole 703, which exposes the connection electrode 217. The upper electrode 253 is connected to the connection electrode 217 through the third contact hole 703. Thereby, the upper electrode 253 and the lower electrode 237, which are interconnected via the connection electrode 217, form an equivalent potential therebetween.

Meanwhile, referring to FIG. 3, the intermediate electrode 252 is connected to the gate electrode 211 of the driving transistor 210 through a sixth contact hole 706. Thereby, the intermediate electrode 252 is connected to both the gate electrode 211 of the driving transistor 210 and the output electrode of the switching transistor 220, thereby functioning as a node that interconnects the gate electrode 211 of the driving transistor 210, the output electrode of the switching transistor 220, and the intermediate electrode of the storage capacitor Cst.

Here, the active layer 200 or 221 may be formed of silicon, amorphous silicon, poly-silicon, or low-temperature poly-silicon (LTPS). In addition, the gate electrode 211 on the active layer 200 or the area in which no gate line GL is formed may be doped with, for example, an N-type dopant or a P-type dopant, thereby being configured as a conductor.

In addition, the active layer 200 or 211 may be formed of a semiconductor oxide. The semiconductor oxide may be selected from among, for example, indium gallium zinc oxide (InGaZnO), indium tin zinc oxide (InSnZnO), indium zinc oxide (InZnO), and tin zinc oxide (SnZnO). In addition, the active layer 200 or 211 may be configured as a conductor via, for example, plasma processing using the gate electrode 211 and the gate line GL as a mask.

Referring to FIGS. 1 and 3, the upper electrode 253 extends to the display area A/A so as to form a pixel electrode 301. Here, the drive voltage, input from the power line PL, is supplied to the pixel electrode 301 by way of the connection electrode 217 of the driving transistor 210 and the upper electrode 253. In other words, the upper electrode 253 functions as a node that interconnects the storage capacitor Cst, the pixel electrode 301 and the first area 213 of the driving transistor 210.

Here, a bank layer 140 is provided in the remaining area excluding the display area A/A, and the display area A/A is defined by the bank layer 140.

The bank layer 140 may be formed of an organic insulation material such as, for example, poly acryl or polyimide, without being necessarily limited thereto.

An organic layer 302 is formed on the bank layer 140 and the pixel electrode 301. The organic layer 302 may include a light-emitting layer in the area that corresponds to the display area A/A, and may be located on the entire surface of the bank layer 140 and the display area A/A.

Here, the organic layer 302 is divided into an electron injection layer (EIL), an electron transport layer (ETL), an emission layer, a hole transport layer (HTL), and a hole injection layer (HIL). In the light-emitting layer, excitons generated via recombination of electrons from a negative electrode and holes from a positive electrode return to a ground state, thereby emitting light within a specific wavelength range.

A second electrode 303 is formed on the organic layer 302. The second electrode 303 may be formed on the entire surface of the substrate 100.

Here, when the first electrode 301 is a positive electrode, the second electrode 303 may be a negative electrode.

Alternatively, when the second electrode 303 is a positive electrode, the first electrode 301 may be a negative electrode.

The shield layer 251 and the intermediate electrode 252 may be formed of a single metal or an alloy thereof selected from among silver (Ag), nickel (Ni), gold (Au), platinum (Pt), aluminum (Al), copper (Cu), molybdenum (Mo), titanium (Ti), and neodymium (Nd), without being necessarily limited thereto.

In addition, the first electrode 301 and the second electrode 303 may be formed of a transparent conductive material such as, for example, indium tin oxide (ITO), indium zinc oxide (IZO), or indium gallium zinc oxide (IGZO), or a single metal or an alloy thereof among the metals that form the shield layer 251 and the intermediate electrode 252, without being necessarily limited thereto.

The sensing transistor 230 includes a channel area 235, a first area 238 and a second area 232. A gate electrode of the sensing transistor 230 may be formed as a portion of the gate line GL, the first area may be a source area, and the second area may be a drain area, without being necessarily limited thereto.

The first area 238 includes a second electrode portion 233, which is in contact with the channel area 235 of the sensing transistor 203 so as to be integrally formed with the channel area 235, and a second extension portion 234, which extends from the second electrode portion 233 and comes into contact with the reference line RL. The reference line RL may be formed in the same layer as the shield layer 251 and the power line VDD using the same material as the shield layer 251 and the power line VDD, without being necessarily limited thereto. The second extension portion 234 is directly connected to the reference line RL through a fifth contact hole 705 formed in the buffer layer 261.

The second area 232 extends from the first area 213 of the driving transistor, i.e., the lower electrode 237 of the storage capacitor Cst so as to be integrally formed with the lower electrode 237. Here, the first area 232 of the sensing transistor 230 serves as an input electrode, and the sensing transistor 230 does not include a separate input electrode.

The shield layer 251, the power line VDD, and the reference line RL are formed of the same metal material. Here, when edge portions of these components are vertically formed, there is a possibility of disconnection of the active layer 200 located thereon. Therefore, in order to prevent disconnection of the active layer 200, the respective edge portions of the shield layer 251, the power line VDD, and the reference line RL may have a tapered shape, and in other words, may be formed to have slopes.

As described above, the driving transistor 220 and the sensing transistor 230 of the present invention has the feature that at least one of input and output electrodes, i.e., source and drain electrodes is omitted and the active layer 200, which is configured as a conductor, is in contact with the respective lines. To this end, the active layer 200, which is configured as a conductor, extends in a line form in order to come into contact with the respective lines, and is connected to the respective lines through contact holes.

Accordingly, the organic light-emitting display device according to one or more embodiments of the present invention may achieve a simplified pixel structure and may reduce the generation of parasitic capacitance, which may be generated between several metals located in different layers, because lines, which have conventionally been formed using a metal of the shield layer or the source/drain electrodes, are formed using the active layer. In addition, when the lines in the pixel are formed using the active layer as described above, the number of contact holes, which are required to interconnect several lines located in different layers and the active layer, may be greatly reduced. Therefore, although a reduction in the area of the pixel drive circuit has conventionally been limited due to a large number of contact holes even if the area of each pixel is reduced, according to the embodiments of the present invention, the pixel drive circuit may be further densely formed owing to a great reduction in the number of contact holes. In this way, according to the embodiments of the present invention, the area of the pixel drive circuit may be reduced in proportion to the reduction in the area of the pixel, which may secure a high aperture ratio of the pixel.

Figure 4:
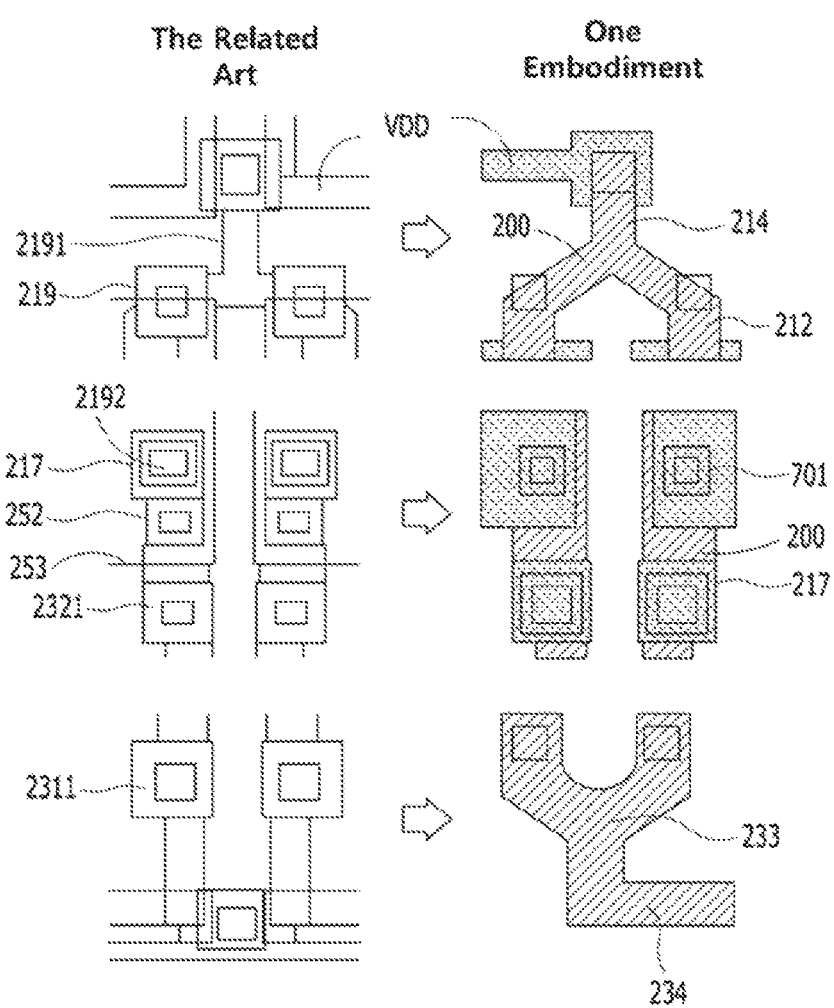
FIG. 4 is a view illustrating variation(s) in the structure of portions designated by dotted squares of FIG. 1 according to an embodiment of the present invention (right side), in comparison to the related art (left side).

FIG. 4 is a view illustrating variation(s) in the structure of portions designated by dotted squares of FIG. 1 of the present invention (right side), in comparison to the related art (left side).

In the related art (left side of FIG. 4), a drain electrode 219 is formed in the same layer as the upper electrode 253 on the drain area of the driving transistor 210 using the same metal as the upper electrode 253, and a line 2191 extending from the drain electrode 219 is connected to the top of the power line VDD through a contact hole.

In addition, the intermediate electrode 252 extends to the area in which the connection electrode 217 is formed and is connected to the shield layer 251 thereunder through a contact hole 2192. The upper electrode 253 extends to form a drain electrode 2321 of the sensing transistor 230. Meanwhile, a source electrode 2311 is located on the first area of the sensing transistor 231, i.e., the source area.

On the other hand, according to one embodiment of the present invention as shown on the right side of FIG. 4, since no line extends from the upper electrode 252 and the active layer 200 forms a line, the drain electrode 219 of the driving transistor 210 is omitted, and the source and drain electrodes 2311 and 2321 of the sensing transistor 230 are also omitted. Thereby, contact holes, which are required to form the source and drain electrodes, are not formed, and a contact hole 701 may be formed only in the buffer layer 261 in order to interconnect the active layer 200 and the shield layer 251. In this case, the area of the contact hole is greatly reduced, compared to a conventional contact hole for interconnecting the metal of the source and drain electrodes and the shield layer 251.

As described above, the organic light-emitting display device according to one embodiment of the present invention may achieve a reduction in the number of contact holes and a great reduction in the area of some contact holes, thereby securing additional available space to enable a reduction in the area of the pixel drive circuit. That is, when the area of the pixel drive circuit is reduced, a display area of the pixel is increased, which increases the aperture ratio of the pixel.

As is apparent from the above description, in an organic light-emitting display device according to one embodiment of the present invention, since some of lines, which have conventionally been formed using a metal material of a shield layer or source and drain electrodes, are formed using an active layer, a simplified pixel structure may be achieved and the possibility of generation of parasitic capacitance between several metals located in different layers may be reduced In addition, when the lines in a pixel are formed using the active layer, the number of contact holes, which are required to interconnect several lines located in different layers and the active layer, may be greatly reduced. Therefore, although a reduction in the area of the pixel drive circuit has conventionally been limited due to a large number of contact holes even if the area of each pixel is reduced, according to the present invention, the pixel drive circuit may be further densely formed owing to a great reduction in the number of contact holes. In this way, according to the embodiments of the present invention, the area of the pixel drive circuit may be reduced in proportion to the reduction in the area of the pixel, which may secure a high aperture ratio of the pixel.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Accordingly, various embodiments disclosed in the present invention are not intended to limit the technical sprit of the present invention, and the scope of the technical sprit of the present invention is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure

What is claimed is:

1. An organic light-emitting display device comprising:
a plurality of pixels arranged in a matrix form; and
a plurality of signal lines configured to supply a signal for driving each pixel,
wherein each pixel includes a driving transistor and a sensing transistor, each of the driving transistor and the sensing transistor including an active layer having a first area and a second area, which are configured as conductors, and a gate electrode,
wherein at least one of the first area and the second area of the active layer of each of the driving transistor and the sensing transistor is directly connected to a corresponding line among the plurality of signal lines, and
wherein the first area of the sensing transistor comes into contact with a first area of a sensing transistor provided in a neighboring pixel, and
wherein the first area of the sensing transistor extends from a point at which the first area of two neighboring sensing transistors are connected to each other and is directly connected to the corresponding line.

2. The organic light-emitting display device according to claim 1, wherein the area directly connected to the corresponding line includes:
an electrode portion integrally formed with a channel area of each of the driving transistor and the sensing transistor, and
an extension portion configured to extend from the electrode portion so as to be directly connected to the corresponding line.

3. The organic light-emitting display device according to claim 1, wherein each pixel further includes a capacitor, and
wherein the capacitor includes:
a shield layer located on a substrate;
a lower electrode configured to overlap the shield layer with a buffer layer interposed therebetween, the lower electrode being connected to the shield layer through a first contact hole and being formed of the active layer, which is configured as a conductor;
an intermediate electrode configured to overlap the active layer with a gate insulation layer and an interlayer insulation layer interposed therebetween; and
an upper electrode configured to overlap the intermediate electrode with a passivation layer interposed therebetween.

4. The organic light-emitting display device according to claim 1,
wherein the driving transistor further includes a connection electrode configured to come into contact with the first area of the driving transistor through a second contact hole, the connection electrode is connected to a pixel electrode through a third contact hole, and the second area of the driving transistor is directly connected to a power line, which supplies a drive voltage to the pixel and is arranged in a vertical direction through a fourth contact hole.

5. The organic light-emitting display device according to claim 4, wherein the second area of the driving transistor includes:
a first electrode portion integrally formed with a channel area of the driving transistor, and
a first extension portion configured to extend from the first electrode portion so as to be connected to the power line.

6. The organic light-emitting display device according to claim 5, wherein the first electrode portion extends from the channel area and is connected to a first electrode portion of a driving transistor of another neighboring pixel, and the first extension portion extends from a point at which the first electrode portions of two neighboring pixels are connected to each other and is connected to the power line.

7. The organic light-emitting display device according to claim 1,
wherein the first area of the sensing transistor is directly connected to a reference line, which supplies a reference voltage to the pixel and senses a voltage charted in the pixel through a fifth contact hole, and
wherein the second area of the sensing transistor extends from the first area of the driving transistor and is integrally formed with the first area of the driving transistor.

8. The organic light-emitting display device according to claim 7, wherein the first area of the sensing transistor includes:
a second electrode portion configured to come into contact with a channel area of the sensing transistor so as to be integrally formed with the channel area, and
a second extension portion configured to extend from the second electrode portion so as to be connected to the reference line, which is arranged in a vertical direction, through the fifth contact hole.

9. The organic light-emitting display device according to claim 8, wherein the second electrode portion comes into contact with a second electrode portion of the sensing transistor provided in the neighboring pixel, and
wherein the second extension portion extends from a point at which the second electrode portions of two neighboring sensing transistors are connected to each other and is directly connected to the reference line through the fifth contact hole.

10. The organic light-emitting display device according to claim 3, wherein the shield layer is formed in the same layer as a power line, which supplies a drive voltage to each pixel, and a reference line, which supplies a reference voltage to the pixel and senses a voltage charged in the pixel using the same material as the power line and the reference line.

11. The organic light-emitting display device according to claim 7, wherein the gate electrode of the sensing transistor is connected to a gate line, which supplies a gate signal to each pixel.

12. The organic light-emitting display device according to claim 10, wherein the shield layer, the reference line and the power line include edge portions each having a tapered shape.

13. The organic light-emitting display device according to claim 1, further comprising a buffer layer interposed between both of the driving transistor and the sensing transistor and the corresponding line, and the buffer layer having a contact hole,
  wherein the at least one of the first area and the second area is disposed in the contact hole to directly contact the corresponding line.

* * * * *